United States Patent
Kim et al.

(10) Patent No.: US 7,666,575 B2
(45) Date of Patent: Feb. 23, 2010

(54) ANTIREFLECTIVE COATING COMPOSITIONS

(75) Inventors: Woo-Kyu Kim, Bridgewater, NJ (US); Hengpeng Wu, Hillsborough, NJ (US); David Abdallah, Bernardsville, NJ (US); Mark Neisser, Whitehouse Station, NJ (US); PingHung Lu, Bridgewater, NJ (US); Ruzhi Zhang, Pennington, NJ (US); M. Dalil Rahman, Flemington, NJ (US)

(73) Assignee: AZ Electronic Materials USA Corp, Somerville, NJ (US)

( * ) Notice: Subject to any disclaimer, the term of this patent is extended or adjusted under 35 U.S.C. 154(b) by 104 days.

(21) Appl. No.: 11/550,459

(22) Filed: Oct. 18, 2006

(65) Prior Publication Data

US 2008/0096125 A1    Apr. 24, 2008

(51) Int. Cl.
G03F 7/09       (2006.01)
G03F 7/11       (2006.01)
G03F 7/30       (2006.01)

(52) U.S. Cl. .................. 430/271.1; 430/326; 430/325; 438/952; 525/219

(58) Field of Classification Search .............. None
See application file for complete search history.

(56) References Cited

U.S. PATENT DOCUMENTS

| | | | |
|---|---|---|---|
| 3,474,054 A | 10/1969 | White | |
| 4,200,729 A | 4/1980 | Calbo | |
| 4,251,665 A | 2/1981 | Calbo | |
| 4,491,628 A | 1/1985 | Ito et al. | |
| 5,187,019 A | 2/1993 | Calbo et al. | |
| 5,350,660 A | 9/1994 | Urano et al. | |
| 5,843,624 A | 12/1998 | Houlihan et al. | |
| 6,447,980 B1 | 9/2002 | Rahman et al. | |
| 6,489,432 B2* | 12/2002 | Jung et al. | 528/230 |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,033,729 B2 | 4/2006 | Jung et al. | |
| 2001/0034427 A1 | 10/2001 | Jung et al. | |
| 2003/0148212 A1* | 8/2003 | Lee et al. | 430/270.1 |
| 2003/0235784 A1 | 12/2003 | Jung | |
| 2006/0177774 A1 | 8/2006 | Abdallah et al. | |
| 2007/0099110 A1* | 5/2007 | Jung | 430/270.1 |
| 2007/0298349 A1 | 12/2007 | Zhang et al. | |
| 2008/0008954 A1 | 1/2008 | Abdallah et al. | |
| 2008/0096125 A1* | 4/2008 | Kim et al. | 430/270.1 |

FOREIGN PATENT DOCUMENTS

| | | | |
|---|---|---|---|
| GB | 2344104 A | * | 5/2000 |
| GB | 2 391 013 A | | 1/2004 |
| WO | WO 00/29906 A2 | | 5/2000 |
| WO | WO 01/98834 A1 | | 12/2001 |

OTHER PUBLICATIONS

Hwang et al "A novel organic bottom anti-reflective coating material for 193 nm excimer laser lithography", Polymer, vol. 41, pp. 6691-6694, year 2000, no month given.*
25% TMAH, Material Safety Data Sheet (MSDS issued Jul. 16, 2004, 4 pages (MLI MSDS TMAH US 16pt 020716.doc).*
S. Kodama et al., "Synthesis of Novel Fluoropolymer for 157nm Photoresists by Cyclo-polymerization", SPIE vol. 4690, pp. 76-83 (2002).
Notification Concerning Transmittal of International Preliminary Report on Patentability (Chapter I of the Patent Cooperation Treaty) (Form PCT/IB/326), International Preliminary Report on Patentability (Form PCT/IB/373), and Written Opinion of the International Searching Authority (Form PCT/ISA/237) for PCT/IB2007/003110.

* cited by examiner

Primary Examiner—Cynthia Hamilton
(74) Attorney, Agent, or Firm—Sangya Jain

(57) ABSTRACT

The present invention relates to an antireflective coating composition comprising, (i) a thermal acid generator; (ii) a crosslinkable polymer comprising at least one aromatic group; and, (iii) a polymeric crosslinker comprising at least one unit of structure (6),

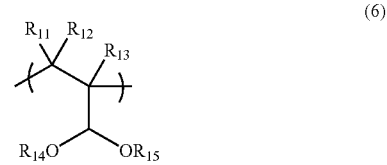

(6)

where $R_{11}$ to $R_{13}$ is independently selected from H, $(C_1\text{-}C_6)$ alkyl and aromatic group, $R_{14}$ and $R_{15}$ are independently $(C_1\text{-}C_{10})$ alkyl. The invention also relates to a process for imaging the antireflective coating composition of the present invention.

10 Claims, No Drawings

ANTIREFLECTIVE COATING COMPOSITIONS

FIELD OF INVENTION

The present invention relates to an absorbing antireflective coating composition comprising a crosslinkable polymer, a polymeric crosslinker and a thermal acid generator, and a process for forming an image using the antireflective coating composition. The process is especially useful for imaging photoresists using radiation in the deep ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed (positive photoresist) or the unexposed areas of the photoresist (negative photoresist).

Positive working photoresists when they are exposed image-wise to radiation have those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Again, a desired portion of the underlying surface is uncovered.

Negative working photoresists when they are exposed image-wise to radiation, have those areas of the photoresist composition exposed to the radiation become insoluble to the developer solution while those areas not exposed remain relatively soluble to the developer solution. Thus, treatment of a non-exposed negative-working photoresist with the developer causes removal of the unexposed areas of the coating and the formation of a negative image in the photoresist coating. Again, a desired portion of the underlying surface is uncovered.

Photoresist resolution is defined as the smallest feature which the photoresist composition can transfer from the photomask to the substrate with a high degree of image edge acuity after exposure and development. In many leading edge manufacturing applications today, photoresist resolution on the order of less than 100 nm is necessary. In addition, it is almost always desirable that the developed photoresist wall profiles be near vertical relative to the substrate, photoresist images are free of residues, have good depth of focus and the photoresist have good long term and short term stability. Good lithographic properties are important for the photoresist. Such demarcations between developed and undeveloped areas of the photoresist coating translate into accurate pattern transfer of the mask image onto the substrate. This becomes even more critical as the push toward miniaturization reduces the critical dimensions on the devices.

The trend towards the miniaturization of semiconductor devices has led to the use of new photoresists that are sensitive at lower and lower wavelengths of radiation and has also led to the use of sophisticated multilevel systems, such as antireflective coatings, to overcome difficulties associated with such miniaturization.

Photoresists sensitive to short wavelengths, less than about 300 nm, are often used where subhalfmicron geometries are required. Particularly preferred are deep uv photoresists sensitive at below 200 nm, e.g. 193 nm and 157 nm, comprising non-aromatic polymers, a photoacid generator, optionally a dissolution inhibitor, and solvent.

The use of highly absorbing antireflective coatings in photolithography is a useful approach to diminish the problems that result from back reflection of radiation from highly reflective substrates. The bottom antireflective coating is applied on the substrate and then a layer of photoresist is applied on top of the antireflective coating. The photoresist is exposed imagewise and developed. The antireflective coating in the exposed area is then typically dry etched using various etching gases, and the photoresist pattern is thus transferred to the substrate. In cases where the photoresist does not provide sufficient dry etch resistance, underlayers or antireflective coatings for the photoresist that are highly etch resistant are preferred, and one approach has been to chemically vapor deposit layers with high content of carbon. Carbon is known to be highly etch resistant for gases used to etch the layers beneath the antireflective coating. However, the deposition of carbon typically requires a vapor deposition technique utilizing expensive vacuum equipment, and therefore is not highly desirable. An organic spin castable antireflective coating which incorporates as high content as possible of carbon into these underlayers is one preferred alternative. Antireflective coatings comprising a polymer and a crosslinking agent comprising a high concentration of carbon are highly desirable. Additionally, the antireflective coating composition which has a minimal concentration of oxygen, nitrogen, halogen, and other noncarbon constituents is desirable, and aromatic moieties, such as phenyl, are very desirable.

The present invention provides for a novel organic spin castable antireflective coating composition for a photoresist, where the composition comprises a crosslinkable polymer which is absorbing and a polymeric crosslinker capable of crosslinking with the crosslinkable polymer in the presence of an acid. The novel antireflective coating is spin castable on the substrate. The antireflective composition of the present invention provides for an underlayer or antireflective coating with high carbon content, and therefore a high degree of etch resistance, that is, a low etch rate relative to the substrate. Such antireflective coatings also function as hard masks for etching the substrate, where the hard mask prevents the substrate from being etched by the etching gases. An antireflective coating composition for high etch rate is disclosed in US 2001/0034427 and U.S. Pat. No. 7,033,729.

The invention also provides for a process for using the antireflective coating to form an image using the novel composition. The novel composition is useful for imaging photoresists which are coated directly over the novel antireflective coating composition or with intervening layers, and also for etching the substrate. The novel composition enables a good image transfer from the photoresist to the substrate, and also has good absorption characteristics to prevent reflective notching and line width variations or standing waves in the photoresist. Additionally, substantially no intermixing is present between the antireflective coating and the film coated over this coating. The antireflective coating also has good solution stability and forms films with good coating quality, the latter being particularly advantageous for lithography.

SUMMARY OF THE INVENTION

The present invention relates to an antireflective coating composition comprising, (i) a thermal acid generator, (ii) a crosslinkable polymer comprising at least one unit with a substituted or unsubstituted phenyl group, and, (iii) a polymeric crosslinker comprising at least one unit of structure (6),

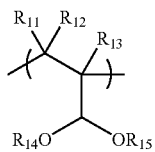

(6)

where $R_{11}$ to $R_{13}$ is independently selected from H, $(C_1-C_6)$ alkyl and aromatic group, $R_{14}$ and $R_{16}$ are independently $(C_1-C_{10})$ alkyl. The invention also relates to a process for imaging the photoresist film coated above the antirefiective coating composition of the present invention.

The invention also relates to an antireflective coating composition comprising, (i) a thermal acid generator: (ii) a crosslinkable polymer comprising at least one unit with a substituted or unsubstituted aromatic group free of nitrogen; and, (iii) a polymeric crosslinker comprising at least one unit of structure (6),

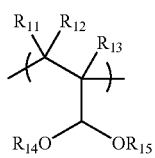

(6)

where $R_{11}$ to $R_{13}$ is independently selected from H, $(C_1-C_{10})$ alkyl and aromatic group, $R_{14}$ and $R_{15}$ are independently $(C_1-C_{10})$ alkyl. The invention also relates to a process for imaging the photoresist film coated above the aritireflective coating composition of the present invention.

The invention also relates to an antirefiective coating composition comprising, (i) a thermal acid generator; (ii) a crosslinkable polymer comprising at least one unit from a group selected from a substituted or unsubstituted naphthyl group and a heterocyclic group; and, (iii) a polymeric crosslinker comprising at least one unit of structure (6),

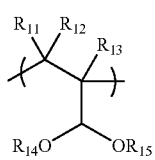

(6)

where $R_{11}$ to $R_{13}$ is independently selected from H, $(C_1-C_6)$ alkyl and aromatic group, and, $R_{14}$ and $R_{15}$ are independently $(C_1-C_{10})$ alkyl. The invention also relates to a process for imaging the photoresist film coated above the antireflective coating composition of the present invention.

DESCRIPTION OF THE INVENTION

The present invention relates to a novel antireflective coating composition for forming an underlayer antireflective coating for a photoresist comprising a thermal acid generator, a crosslinkable polymer and a polymeric crosslinker capable of crosslinking with the crosslinkable polymer. The invention also relates to a process for imaging the photoresist coated over the novel antireflective coating composition and provides good lithographic results. The antireflective coating composition is useful for imaging photoresists with deep ultraviolet radiation.

The crosslinkable polymer comprises an absorbing moiety which can absorb the radiation used to expose the photoresist, such as an aromatic moiety, and a crosslinkable group or crosslinkable site. The crosslinkable group may be selected from those that crosslink with the polymeric crosslinker in the presence of an acid, such as hydroxyl, methylol, and other functional groups. The crosslinkable polymer can comprise both an absorbing chromophore and a crosslinkable group or site capable of crosslinking with the polymeric crosslinker in the presence of an acid. The absorbing chromophore is typically an aromatic moiety which is capable of absorbing the radiation used to expose the photoresist coated over the antireflective coating. The radiation absorbed by the polymer can range are typically below 300 nm, typically 248 nm, 193 nm and 157 nm. Monocyclic aromatic, such as substituted or unsubstituted phenyl, are preferred for absorption of 193 nm and lower wavelength radiation. The aromatic moiety can be exemplified without limitations by substituted or unsubstituted phenyl, substituted or unsubstituted naphthyl, substituted or unsubstituted anthracyl, and substituted or unsubstituted monocyclic heteroaromatics. In one embodiment the unit comprising the aromatic group is free of nitrogen. In one embodiment substituted or unsubstituted phenyl moieties are preferred. In another embodiment crosslinkable polymers free of nitrogen are preferred. In yet another embodiment a crosslinkable polymer free of nitrogen and comprising substituted or unsubstituted aromatic moieties are preferred. In another embodiment a crosslinkable polymer free of nitrogen and comprising phenyl moieties is preferred, since the etch rate of the coating should be as low as possible. In yet another embodiment of the crosslinkable polymer, the polymer comprises at least one unit from a group selected from a substituted or unsubstituted naphthyl group and a heterocyclic group.

The crosslinkable polymer comprising a substituted or unsubstituted phenyl group may be a styrenic unit or an aromatic acrylate unit.

In one embodiment, the antireflective composition comprises a crosslinkable polymer where the polymer may be a homopolymer or a copolymer comprising a unit of structure (1). In one embodiment the crosslinkable polymer of the present invention comprises at least one unit of structure (1), where, R is selected from H and $C_1-C_6$ alkyl and $R_1$ is independently selected from H, hydroxy, $C_1-C_6$ alkyl, $C_1-C_6$ alkylenehydroxy, $C_1-C_6$ ester, and $C_1-C_6$ carboxylic acid, and n=1-5.

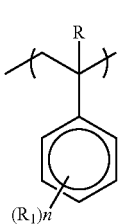
(1)

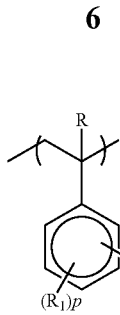
(5)

The polymer may further comprise other comonomeric units. Examples of comonomeric units are such as those of structure (2), (3), (4) or mixtures of these.

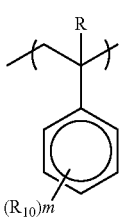
(2)

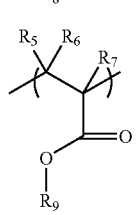
(3)

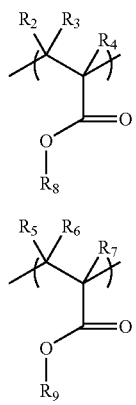
(4)

where, R is selected from H and $C_1$-$C_6$ alkyl; $R_2$ to $R_7$ are independently selected from H, $C_1$-$C_6$ alkyl, and $C_1$-$C_6$ alkylenehydroxy; $R_8$ is a nonaromatic group such as an aliphatic group; $R_9$ comprises an aromatic moiety; $R_{10}$ is independently selected from H and ($C_1$-$C_6$)alkyl, and m is 1-5. $R_8$ may be an unsubstituted or substituted aliphatic group, where the aliphatic group is linear alkylene, branched alkylene, cycloaliphatic alkylene (such as norbornyl, adamantyl, hydroxyadamantyl or another substituted adamantyl group), hydroxyalkylene, etc. $R_9$ may be a unsubstituted or substituted monoaromatic moiety like unsubstituted or substituted phenyl, unsubstituted or substituted hydroxyphenyl, unsubstituted or substituted alkylenephenyl, etc. $R_9$ may also be an anthracyl moiety free of nitrogen, naphthyl moiety or heterocyclic moiety. R and $R_{10}$ can be hydrogen. Other types of comonomeric unit or units may also be incorporated into the crosslinkable polymer, such as cyclic anhydrides, for example maleic anhydride.

In one embodiment of the crosslinkable polymer, the crosslinkable polymer comprises at least one unit of structure (5), where, R is selected from H and $C_1$-$C_6$ alkyl and $R_1$ is independently selected from H, hydroxy, $C_1$-$C_6$ alkyl, $C_1$-$C_6$ alkylenehydroxy, $C_1$-$C_6$ ester, and $C_1$-$C_6$ carboxylic acid, and p=1-4. A hydroxystyrene (co)polymer comprising styrenic monomeric units is one embodiment of a crosslinkable polymer, where the styrenic units can be derived from structure (5) and structure (2). The polymer may be a copolymer comprising hydroxystyrene (structure 5) and structure (2). The copolymer may be 4-hydroxystyrene and styrene. A hydroxystyrene (co)polymer comprising at least one unit of structure (1) and (meth)acrylates and/or esters is another embodiment of the crosslinkable polymer. In another embodiment, the crosslinkable polymer comprises unit of structure (5) and a (meth)acrylate of structure (3), and the structures are as defined previously. The use of nonaromatic acrylate comonomers allows the absorption extinction coefficient (k) to be adjusted for exposure. Such crosslinkable polymers are synthesized using standard techniques of polymerization.

One embodiment of the crosslinkable polymer is an acrylate type of polymer comprising at least one unit derived from an aromatic (meth)acrylate; as an example, where the polymer comprises at least one unit of structure (4). In one embodiment of structure (4), $R_9$ comprises a phenolic group, which is capable of crosslinking with the polymeric crosslinker. The polymer may be a homopolymer or the polymer may comprise other comonomers, such as other acrylate monomeric units of structure (3). In another embodiment of $R_9$, $R_9$ may be an aromatic group selected from anthracyl group free of nitrogen, naphthyl group or heterocyclic group. Other comonomers, e.g. of structure (3) as defined previously, may be incorporated into the polymer.

In the crosslinkable polymer, the polymer may be a homopolymer or the comonomeric unit(s) in the copolymer can range from about 5 to about 95 mole %.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moeity. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicycle[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents. Examples of multicyclic alkyls are unsubstituted or substituted, norbornyl and adamantyl groups.

Alkylene groups are divalent alkyl groups derived from any of the alkyl groups mentioned hereinabove. When referring to alkylene groups, these include an alkylene chain substituted with ($C_1$-$C_6$) alkyl groups in the main carbon chain of the alkylene group. Alkylene groups can also include one or more alkyne or alkene groups in the alkylene moiety, where alkyne refers to a triple bond and alkene refers to double bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above, such as adamantyl. Cylcoalkylene groups may be unsubstutited or substituted with groups such as hydroxyl, alkoxy, etc. Examples of multicyclic alkylenes are unsubstutited or substituted, norbornyl and adamantyl groups.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, anthracenes, pyrenes and the like.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

The term (meth)acrylate refers to methacrylate or acrylate, and similarly, (meth)acrylic refers to methacrylic or acrylic.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds unless stated otherwise. The present antireflective composition comprises a crosslinkable polymer, a thermal acid generator and a polymeric crosslinker. The polymeric crosslinker is capable of crosslinking with the crosslinkable polymer in the presence of an acid. Heat curing a film of the present novel composition leads to a film which is insoluble in the solvent of the photoresist coated on top of the antireflective film. The polymeric crosslinker which has the minimal amount of heteroatoms, such as oxygen, nitrogen and sulfur, and the maximum amount of carbon is preferred. The polymeric crosslinker of the present invention comprises at least one unit with the structure (6),

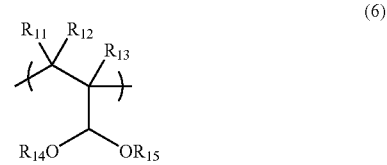

(6)

where $R_{11}$ to $R_{13}$ are independently selected from H, ($C_1C_6$) alkyl and aromatic group, and $R_{14}$ and $R_{15}$ are independently ($C_1$-$C_{10}$) alkyl. In one embodiment of the unit of structure (6); $R_{14}$ and $R_{15}$ are methyl and $R_{11}$ to $R_{13}$ are hydrogen or $R_{11}$ to $R_{13}$ can be hydrogen or methyl and $R_{14}$ and $R_{15}$ can be methyl, ethyl, n-propyl, isopropyl, n butyl and t-butyl. In another embodiment of the unit of structure (6), $R_{11}$ to $R_{13}$ are independently H, ($C_1$-$C_6$) alkyl and $R_{14}$ and $R_{15}$ are independently ($C_1$-$C_{10}$) alkyl. In yet another embodiment of the unit of structure (6), $R_{11}$ to $R_{13}$ are independently selected from H and aromatic group (such as phenyl, naphthyl and anthracyl), and $R_{14}$ and $R_{15}$ are independently ($C_1$-$C_{10}$) alkyl. Mixtures of different types of units of structure (6) may be used. The crosslinking polymer may additionally comprise other comonomeric units, such as styrenic or (meth)acrylates. Examples of monomers used to form the comonomeric unit are styrene. The comonomeric unit can range from 10 to 90 mole % of the polymer. A polymeric crosslinker is preferred to a monomeric crosslinking compound since during any heating process of the film there is a lower possibility of volatile components being lost from the film and creating residues. Additionally the polymeric crosslinker contains a minimal amount of heteroatoms and a large amount of carbon atoms. In one embodiment of the crosslinking polymer, it is free of nitrogen.

The carbon content of the antireflective composition after curing is greater than 75% by weight, preferably greater than 80 weight % and more preferably greater than 85 weight %. The carbon content is increased by selecting polymers with as high a carbon content as possible, for example a styrenic unit has a higher carbon content than a hydroxystyrenic unit. Heteroatoms reduce the carbon content of the film.

Typically, the polymeric crosslinker can be made by polymerizing an aldehyde ((meth)acrolein and/or aromatic aldehyde or any other analogous aldehyde), and then reacting the resulting polymer with an ($C_1$-$C_{10}$) alkyl alcohol. Examples of ($C_1$-$C_{10}$) alkyl alcohol include methanol, propanol, butanol, penatanol, hexanol, heptanol, octanol, decanol and their isomers. The polymerization may be carried out temperatures 60-70° C. for 1-24 hours in the presence of a polymerization initiator, like azobisisobutyronitrile (AIBN), in a solvent. The polymer is then reacted in the presence of a suitable solvent with the alcohol or acid at temperatures ranging from room temperature to about 70° C. for 20-30 hours. The polymer is isolated and cleaned. Typical solvents can be tetrahydrofuran, cyclohexanone, dimethylformamide, dimethysulfoxide, dioxane, methyethylketone, benzebe, toluene, xylene and mixtures thereof.

The polymers of this invention are polymerized using conventional techniques to give a polymer with a weight average molecular weight from about 1,000 to about 500,000, preferably from about 2,000 to about 50,000, more preferably from about 3,000 to about 30,000.

The thermal acid generator of the present invention is capable of generating a strong acid upon heating. The thermal acid generator (TAG) used in the present invention may be any that upon heating generates an acid which can react with the crosslinkable polymer of the present invention, particularly preferred is a strong acid such as a sulfonic acid. Preferably, the thermal acid generator is activated at 90° C. and more preferably at above 120° C., and even more preferably at above 150° C. A curing temperature ranging from about 200° C. to 300° C. can also be used. The curing is for a sufficient length of time to harden the film, typically 30 seconds to 10 minutes. Examples of thermal acid generators are metal-free iodonium and sulfonium salts. Examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. Iodonium salts can be exemplified by iodonium fluorosulfonates, iodonium tris(fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl)methide, and iodonium quaternary ammonium bis(fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The antireflection coating composition of the present invention contains 1 weight % to about 15 weight % of the crosslinkable polymer, and preferably 4 weight % to about 10 weight % of total solids. The composition also contains 1 weight % to about 15 weight % of the polymeric crosslinker, and preferably 4 weight % to about 10 weight % of total solids The thermal acid generator, may be incorporated in a range from about 0.1 to about 10 weight % by total solids of the antireflective coating composition, preferably from 0.3 to 5 weight % by solids, and more preferably 0.5 to 2.5 weight % by solids.

The film thickness of the antireflective coating can range from about 10 nm to about 300 nm.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodnium salts, triphenyl sulfonium salts, dialkyl iodonium salts, triakylsulfonium salts, and mixtures thereof.

The antireflective coating composition comprises the crosslinkable and polymeric crosslinkers and the acid generator of the instant invention and a suitable solvent or mixtures of solvents. Other components may be added to enhance the performance of the coating, e.g. monomeric dyes, lower alcohols, crosslinking agents, surface leveling agents, adhesion promoters, antifoaming agents, etc. Other polymers may be added to the present antireflective coating composition, where the additional polymer may be used to adjust the absorption extinction coefficient (k) to lower values, such as polymers that do not absorb the exposure radiation, e.g. polyadamantyl methacrylate. The additional polymer may be added at levels ranging from 1 weight % to 50 weight %.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.15 to about 0.8 as measured using ellipsometry. The refractive index (n) of the antireflective coating is also optimized and can range from 1.3 to about 1.9, preferably 1.5 to about 1.8. The n and k values can be calculated using an ellipsometer, such as the J. A. Woollam WVASE VU-302™ Ellipsometer. The exact values of the optimum ranges for k and n are dependent on the type of application.

The antireflective coating composition is coated on the substrate using techniques well known to those skilled in the art, such as dipping, spin coating or spraying. The film thickness of the antireflective coating ranges from about 10 nm to about 300 nm. The coating is further heated on a hot plate or convection oven for a sufficient length of time to remove any residual solvent and induce crosslinking, and thus insolubilize the antireflective coating to prevent intermixing between the antireflective coating and the photoresist. The preferred range of temperature is from about 90° C. to about 350° C. The present novel coating layer may be coated under or over other antireflective coatings or underlayers, such as those containing silicon. Silicon may be present in the polymer generally known as siloxanes. Siloxane and silsesquioxane polymers which can be used as the backbone of the polymer are known and disclosed in the U.S. patent application with the Ser. Nos. 11/425,813 and 11/425,817, and to these the functionalities that increase the refractive index, functionalities that are absorbing and functionalities that are crosslinking, described above may be attached. Thus siloxane or silsesquioxane polymers may have pendant moieties used to increase refractive index such as those described previously, chromophores containing moiety described previously or a combination of these. The moiety used to increase refractive index may be sulfur based, such as those comprising sulfide or sulfone described previously. A siloxane polymeric unit may be exemplified by comprising at least one repeating unit derived from a monomer of formula $((A)_j R_{11} SiO_{(3-j)/2})$, where $R_{11}$ is selected from the moiety with the high refractive index described previously; A is an unreacted functional group of a monomer which forms either of the above repeating units; and j falls within the range $0 \leq j \leq 1$. A siloxane polymer may also be described by the structure, $(R^1 SiO_{3/2})_a (R^2 SiO_{3/2})_b (R^3 SiO_{3/2})_c (SiO_{4/2})_d (R^4 R^5 SiO)_e$, where, $R^1$ is a moiety comprising a crosslinking group, $R^2$ is a moiety comprising a chromophore group, $R^3$, $R^4$ and/or $R^5$ are independently selected from the moiety with the high refractive index described previously and a hydrocarbon moiety, $0<a<1$; $0<b<1$, $0\leq c<1$; $0\leq d<1$; and $a+b+c+d=1$. Other variations of these types of polymers may also be used. In one embodiment the present inventive antireflective coating is coated under a silicon containing antireflective coating and the photoresist is coated over the silicon containing antireflective coating.

A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists, positive and negative, can be any of the types used in the semiconductor industry, provided the photoactive compound in the photoresist and the antireflective coating absorb at the exposure wavelength used for the imaging process. Photoresists used are sensitive to wavelengths below 300 nm. Photoresists sensitive to 248 nm, 193 nm, 157 nm and extreme ultraviolet, and photoresists or analogous materials used in nano imprinting are useful.

To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; U.S. Pat. No. 6,818,258) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various gases are known in the art for etching organic antireflective coatings, such as those comprising $CF_4$, $CF_4/O_2$, $CF_4/CHF_3$, $O_2$ or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE302 ellipsometer.

The molecular weight of the polymers was measured on a Gel Permeation Chromatograph.

EXAMPLES

Synthesis Example 1

160 g of acrolein, 500 g tetrahydrofuran (THF) and 3.2 g of azobisisobutyronitrile (AIBN) were charged into a suitable flask with a stirrer and condenser. After nitrogen purge for 1 hr, the reaction mixture was stirred at 65° C. for 23 hrs. After the reaction mixture was cooled to room temperature, it mixture was poured into ether. The solid obtained was isolated by filtration. The solid was then dissolved in 500 g of methanol in a reaction flask. After 1 g of oxalic acid was added, the reaction mixture was stirred at 65° C. for 20 hrs. After cooling to room temperature, the reaction solution was poured into water under stirring. The white polymer obtained was isolated by filtration and dried in a vacuum oven overnight. The proton NMR results for the polymer were: $^1$H NMR (ppm): 1.0-2.0 (3H), 3.2-3.4 (6H), and 4.2-4.6 (1H).

Formulation Example 2

1.5 g of the vinyl benzene/4-hydroxystyrene copolymer available from DuPont Corporation, Corpus Christi Technical Center, 1901 Clarkwood Road, Corpus Christi, Tex. 78469, and 0.5 g of the polymer (PDMP) described in Example 1, were dissolved in a mixture of propylene glycol monomethyl ether acetate (PGMEA) and propylene glycol monomethyl ether (PGME) (70/30 PGMEA/PGME) to achieve 10.0 wt % of total solids. To that, 40 mg of dodecylbenzene sulfonic acid (DBSA), a thermal acid generator, was added. The mixture was allowed to mix until the materials became completely soluble. The homogeneous solution was filtered with 0.2 μm membrane filter. This filtered solution was spin-coated on a 8" silicon wafer at 1200 rpm. The coated wafer was baked on a hotplate at 225° C. for 90 seconds. Then, n and k values were measured with a VASE Ellipsometer manufactured by J. A. Woollam Co. Inc. The optical constants n and k of the Si-containing film for 193 nm radiation were 1.66 and 0.86 respectively.

Lithographic Example 2

A solution of Formulation Example 2 above was spin coated on a bare silicon wafer and baked at 250° C. for 90 seconds for curing. Spin speed was adjusted so that film thickness of 250 nm was achieved after the bake process. Above the cured film of Formulation Example 2, an antireflective coating solution, AZ® EXP ArF-S10A, available from AZ Electronic Materials USA Corp., was spin-coated. A hard bake at 250° C. for 90 seconds was applied to cure the antireflective coating. To the film stack, a positive working 193 nm photoresist formulation, AZ® AX2110P, also available from AZ Electronic Materials USA Corp., was spin-coated and soft-baked at 100° C. for 60 seconds to give a film thickness of 190 nm. The photoresist was then exposed by a Nikon 306D scanner (numerical aperture of 0.85 and dipole-illumination) with a 6% half-tone phase shift mask. After the exposure, the wafer was subjected to a post-exposure bake step at 110° C. for 60 sec. The imaged photoresist was then developed with a 2.38 weight % aqueous solution of tetramethyl ammonium hydroxide for 30 sec. The line and space patterns were then observed by a scanning electron microscope. The photoresist showed an excellent resolution down to 75 nm (1:1 pitch), free from scum and photoresist residue.

Synthesis Example 3

Acetoxystyrene (16.22 g, 0.5 mole) was placed in a 500 mL flask, 3-hydroxy adamantly methacrylate (HAdMA) (23.63 g, 0.5 mole), 1.20 g of AIBN, and 119 g of THF were added and heated under nitrogen at 69° C. for 7 hours. After the reaction, the polymer was isolated from acidified deionized water (DI) water (1.5 liter, ~0.1% HCl), washed with DI water several times, dried in an oven under vacuum. The polymer (39 g) was re dissolved in methanol (20% solid), 0.5 g of conc. HCl was added and refluxed for 4 hours. The polymer was isolated from DI water (1.5 liter) and washed several times with DI water and dried under vacuum. The yield was 33 g yield, weight average molecular weight was 14, 127, polydispersity was 1.62, and thermal glass transition temperature, Tg, was 169° C. The refractive index (n) and absorption (k) were measured with the ellipsometer to give a value of 1.63 and 0.42 respectively.

Synthesis Example 4

Acetoxystyrene (16.22 g, 0.5 mole) was taken in a 500 mL flask, adamantly methacrylate (AdMA) (22.03 g, 0.5 mole), 1.50 g of AIBN, and 119 g of THF were added and heated under nitrogen at 69° C. for 7 hours. After the reaction, 120 g of methanol was added and 1 g of HCl (37%) was also added and reflux for 4 hours. The polymer was isolated from DI water washed with DI water several times, dried in an oven under vacuum. The polymer yielded 30 g, Mw=9923, polydispersity=1.82, and Tg=182° C.

The refractive index (n) and absorption (k) were measured with the ellipsometer to give a value of 1.56 and 0.46 respectively.

Example 5

1.5 g of polymer described in Example 2 and 0.5 g of PDMP described in Example 1, were dissolved in a mixture of ethyl lactate (EL) and propylene glycol monomethyl ether (PGME) (90/10 EL/PGME) to achieve 10.0 wt % of total solids. To that, 40 mg of DBSA, a thermal acid generator, was added. The mixture was allowed to mix until all the materials become soluble. The homogeneous solution was filtered with 0.2 μm membrane filter. This filtered solution was spin-coated on a 8" silicon wafer at 1200 rpm. The coated wafer was baked on hotplate at 225° C. for 90 seconds. Then, n and k values were measured with a VASE Ellipsometer manufactured by J. A. Woollam Co. Inc. The optical constants n and k of the Si-containing film for 193 nm radiation were 1.632 and 0.348 respectively.

Example 7

0.47 g of the vinyl benzene/4-hydroxystyrene copolymer available from DuPont Corporation, 0.47 g of TG-6072 a substituted polyacrylic polymer (available from Mitshubishi Rayon Co., LTD. 641 Konan 1-Chome, Minato-Ku, Tokyo, 108-8506, Japan) and 0.31 g of PDMP described in Example 1, were dissolved in a mixture of propylene glycol monomethyl ether acetate (PGMEA) and propylene glycol monomethyl ether (PGME) (70/30 PGMEA/PGME) to achieve 10.0 wt % of total solids. To that, 40 mg of DBSA, a thermal acid generator was added. The materials were allowed to mix until the solution became completely soluble. The homogeneous solution was filtered through a 0.2 μm membrane filter. This filtered solution was spin-coated on a 8" silicon wafer at 1200 rpm. The coated wafer was baked on a hotplate at 250° C. for 90 seconds. Then, n and k values were measured with a VASE Ellipsometer manufactured by J. A. Woollam Co. Inc. The optical constants n and k of the above film for 193 nm radiation were 1.87 and 0.22, respectively.

The invention claimed is:

1. An antireflective coating composition comprising,
   (i) a thermal acid generator;
   (ii) a crosslinkable copolymer comprising at least one unit with structure (1) and at least one unit with structure (2) and further where the crosslinkable polymer is free of acrylate groups and where structure (1) and (2) are,

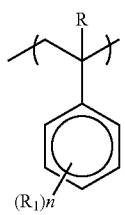
(1)

where, R is selected from H and $C_1$-$C_6$ alkyl and $R_1$ is independently selected from H, hydroxyl, $C_1$-$C_6$ alkyl, $C_1$-$C_6$ alkylenehydroxy, $C_1$-$C_6$ ester and $C_1$-$C_6$ carboxylic acid, and n=1-5; and

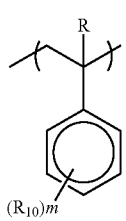
(2)

where, R and $R_{10}$ are independently selected from H and ($C_1$-$C_6$)alkyl, and m is 1-5; and
   (iii) a polymeric crosslinker comprising at least one unit of structure (6),

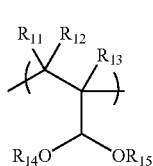
(6)

where $R_{11}$ to $R_{13}$ are independently selected from H, ($C_1$-$C_6$) alkyl and aromatic group, and, $R_{14}$ and $R_{15}$ are independently ($C_1$-$C_{10}$) alkyl.

2. The composition of claim 1, where the unit of structure (1) is further defined by structure (5),

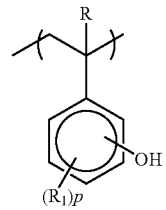
(5)

where, R is selected from H and $C_1$-$C_6$ alkyl and $R_1$ is independently selected from H, hydroxyl, $C_1$-$C_6$ alkyl, $C_1$-$C_8$ alkylenehydroxy, $C_1$-$C_6$ ester and $C_1$-$C_6$ carboxylic acid, and p=1-4.

3. The composition of claim 1, where $R_{14}$ and $R_{15}$ are methyl.

4. The composition of claim 1, where the polymeric crosslinker further comprises a styrenic or (meth)acrylate unit.

5. The composition of claim 1, where the thermal acid generator is selected from iodonium salts, tosylates, derivatives of benzene sulfonic acid salts, and derivatives of naphthalene sulfonic acid salts.

6. The composition of claim 1 where the carbon content of the composition after curing is greater than 75% by weight.

7. A process for imaging a photoresist comprising the steps of,
   a) forming a antireflective coating from an antireflective coating composition of claim 1 on a substrate;
   b) forming a coating of a photoresist over an antireflective coating;
   c) imagewise exposing the photoresist with an exposure equipment; and,
   d) developing the coating with an aqueous alkaline developer.

8. The process according to claim 1 where radiation for imagewise exposure is selected from 248 nm, 193 nm and 157 nm.

9. The process according to claim 1 where the developer in an aqueous solution of tetramethyl ammonium hydroxide.

10. An antireflective coating composition comprising,
    (i) a thermal acid generator;
    (ii) a crosslinkable acrylate polymer comprising units of structure (3) and (4),

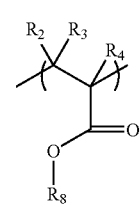
(3)

-continued

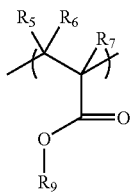
(4)

where, $R_2$ to $R_7$ are independently selected from H, $C_1$-$C_6$ alkyl and $C_1$-$C_6$ alkylenehydroxy, $R_8$ is an nonaromatic, and $R_9$ comprises an aromatic moiety group selected from unsubstituted phenyl; and, (iii) a polymeric crosslinker comprising at least one unit of structure (6),

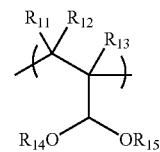
(6)

where $R_{11}$ to $R_{13}$ is independently selected from H, $(C_1$-$C_6)$ alkyl and aromatic group, and, $R_{14}$ and $R_{15}$ are independently $(C_1$-$C_{10})$ alkyl.

* * * * *